United States Patent
Medra et al.

(10) Patent No.: US 10,944,441 B2
(45) Date of Patent: Mar. 9, 2021

(54) RECEIVER WITH BROADBAND LOW-NOISE AMPLIFIER AND FILTER BYPASS

(71) Applicant: QUALCOMM Incorporated, San Diego, CA (US)

(72) Inventors: Alaaeldien Mohamed Abdelrazek Medra, San Diego, CA (US); Francesco Gatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/410,322

(22) Filed: May 13, 2019

(65) Prior Publication Data
US 2020/0366325 A1     Nov. 19, 2020

(51) Int. Cl.
*H04B 1/16* (2006.01)
*H03F 1/56* (2006.01)
*H03F 3/19* (2006.01)

(52) U.S. Cl.
CPC ............. *H04B 1/16* (2013.01); *H03F 1/565* (2013.01); *H03F 3/19* (2013.01); *H03F 2200/165* (2013.01); *H03F 2200/294* (2013.01); *H03F 2200/387* (2013.01); *H03F 2200/451* (2013.01)

(58) Field of Classification Search
CPC combination set(s) only.
See application file for complete search history.

(56) References Cited

U.S. PATENT DOCUMENTS

| | | | | |
|---|---|---|---|---|
| 2010/0202325 A1* | 8/2010 | Poulin | ..................... | H04B 1/006 370/280 |
| 2012/0009886 A1* | 1/2012 | Poulin | .................. | H04B 7/0825 455/78 |
| 2017/0163215 A1* | 6/2017 | Gorbachov | ............. | H03F 3/245 |
| 2018/0019710 A1* | 1/2018 | Ayranci | ................... | H03F 3/195 |
| 2018/0048345 A1* | 2/2018 | Pehlke | ...................... | H04B 1/40 |
| 2019/0165755 A1* | 5/2019 | Tsai | ........................ | H03H 7/463 |
| 2019/0245497 A1* | 8/2019 | Sanner | .................. | H03F 1/0211 |
| 2020/0220568 A1* | 7/2020 | Watanabe | ............... | H03F 3/195 |

* cited by examiner

*Primary Examiner* — Junpeng Chen
(74) *Attorney, Agent, or Firm* — QUALCOMM Incorporated (57) ABSTRACT

A receiver front end is provided with a bypass mode of operation in which a received carrier-aggregated RF signal bypasses a bandpass filter to drive a broadband low-noise amplifier. The low-noise amplifier amplifies the carrier-aggregated RF signal to form an amplified RF signal.

29 Claims, 11 Drawing Sheets

RECEIVER WITH BROADBAND LOW-NOISE AMPLIFIER AND FILTER BYPASS

TECHNICAL FIELD

This application relates to receiver front ends, and more particularly to a receiver front end with a filter bypass for carrier-aggregation modes of operation.

BACKGROUND

The radio frequency (RF) spectrum for wireless communication is not unlimited so its use is regulated. As part of this regulation, users are assigned to specific frequency bands. While communicating over an assigned band from one device (e.g., user equipment) to another, the use of a frequency band generally requires some coordination to limit interference between transmission and reception. For example, this coordination may be achieved through time division duplexing (TDD) in which a user transmits over an assigned band during a first time interval and then receives over the assigned band during a non-overlapping second time interval. In this fashion, a transmitted signal does not interfere with a received signal. Alternatively, an assigned band may be sub-divided into a transmitting sub-band and a receiving sub-band through frequency division duplexing (FDD).

The duplexing mode (TDD or FDD) has consequences on the RF signal path within the receiver. The RF signal path extends from a receiving antenna through a low-noise amplifier (LNA). Depending upon the modulation, the output of the LNA may then mixed with a local oscillator signal to recover the desired baseband signal. If the assigned frequency band is an FDD band, the RF signal path between the receiving antenna and the LNA will generally require a bandpass filter to exclude signals that would arrive on neighboring frequency bands.

Accordingly, there is the need for receivers configured for carrier aggregation applications offering increased signal-to-noise power and reduced noise figure.

SUMMARY

A receiver front end is disclosed that includes a bandpass filter configured to filter a received radio-frequency (RF) signal to provide a filtered RF signal within a first frequency band; a bypass path configured to bypass the bandpass filter with the received RF signal to provide a bypassed RF signal; a low-noise amplifier configured to amplify an input RF signal into an amplified RF signal; a switch matrix having a first configuration in which the input RF signal is the filtered RF signal and having a second configuration in which the input RF signal is the bypassed RF signal, and a matching network coupled to an amplifier output node for the low-noise amplifier, the matching network being configured to select for the first frequency band to drive a matching network first output node and being configured to select for a second frequency band to drive a matching network second output node.

In addition, a method of operation for a receiver front end is disclosed that includes the acts of receiving a carrier-aggregated RF signal over at least one antenna, wherein the carrier-aggregated RF signal is a carrier aggregation of a first RF signal in a first frequency band and of a second RF signal in a second frequency band; propagating the carrier-aggregated RF signal from the at least one antenna over a bypass path that bypasses a bandpass filter to an input port of a low-noise amplifier; and amplifying the carrier-aggregated RF signal in the low-noise amplifier to provide an amplified RF signal.

Moreover, a receiver front end circuit is disclosed that includes a transformer having an input terminal for receiving an amplified carrier-aggregated RF signal, the transformer having a first tap and a second tap; a first resonant circuit coupled to the first tap through a first capacitor, the first resonant circuit configured to pass a first RF carrier signal modulated over a first frequency band and to block a second RF carrier signal modulated over a second frequency band; and a second resonant circuit coupled to the second tap through a second capacitor, the second resonant circuit configured to pass the second RF carrier signal modulated over the second frequency band and to block the first RF carrier signal modulated over the first frequency band.

Finally, a receiver front end is disclosed that includes a first bandpass filter configured to select for a first frequency band; a bypass path; a second bandpass filter configured to select for a second frequency band; a first low-noise amplifier; a second low-noise amplifier; a switch matrix having a first configuration in which an at least one antenna is coupled through the bypass path to the first low-noise amplifier and in which the at least one antenna is isolated from the second low-noise amplifier, the switch matrix having a second configuration in which the at least one antenna is coupled through the first bandpass filter to the first low-noise amplifier and is coupled through the second bandpass filter to the second low-noise amplifier.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A receiver front end is disclosed that includes a switch matrix having a bypass configuration and a jammer configuration. In the bypass configuration, the switch matrix is configured so that a carrier-aggregated RF signal received over an at least one antenna propagates over a bypass path to an input node of a broadband low-noise amplifier. The bypass path bypasses a first bandpass filter that selects for a first frequency band. The carrier-aggregated RF signal includes a first RF carrier that is modulated over the first frequency band to form a first RF signal. Similarly, the carrier-aggregated RF signal includes a second RF carrier that is modulated over a second frequency band to form a second RF signal.

During a bypass mode of operation for the receiver front end in which the received RF signal is a carrier-aggregated signal, the switch matrix is controlled to be in the bypass configuration so that the broadband low-noise amplifier amplifies the carrier-aggregated RF signal. A jammer detector detects for the presence of a jamming signal to control whether the bypass mode of operation is selected. In the presence of a jamming signal, the jammer detector controls the switch matrix to be in the jammer configuration so that the receiver front end operates in a jammer mode of operation. In the jammer mode of operation, the switch matrix selects for the first bandpass filter and also a second bandpass filter. The carrier-aggregated signal is thus split between the first bandpass filter and the second bandpass filter during the jammer mode of operation. When selected by the switch matrix, the second bypass filter selects for the second frequency band to drive another low-noise amplifier. Although both modes of operation result in the amplification of the first and second RF signals, the bypass mode of operation does not suffer from a bandpass filter insertion loss so as to have a higher signal power as compared to the jammer mode of operation. Moreover, the bypassing of the first and second bandpass filters in the bypass mode of operation reduces noise. In addition, the use of a single broadband low-noise amplifier conserves power.

During the bypass mode of operation with carrier aggregation, the at least one antenna receives a carrier-aggregated RF signal that includes a first RF carrier signal that is modulated over a first frequency band to form a first RF signal and further includes a second RF carrier signal that is modulated over a second frequency band to form a second RF signal. The bandpass filter has a bandwidth that selects for one of the frequency bands. The bypass path is selected during the bypass mode of operation so that the LNA amplifies the carrier-aggregated RF signal. A particularly advantageous broadband LNA will be discussed further herein that can accommodate the amplification across such a relatively wide bandwidth.

Such broadband behavior is advantageous since no other LNA is needed for the amplification of the carrier-aggregated RF signal. The matching network may be configured to split the amplified RF signal from the LNA into an amplified version of the first RF signal and into an amplified version of the second RF signal. In such embodiments, the LNA drives a primary side of a transformer. A secondary side of the transformer may include a first tap for the amplified version of the first RF signal and a second tap for the amplified version of the second RF signal. Note that the two taps may have different winding lengths and thus different inductances. The first tap couples to a first capacitor whereas the second tap couples to a second capacitor. As used herein, the term "couples" without any additional qualifiers denotes an electrical connection that may be either direct (no intervening elements) or indirect through intervening elements. The inductance set by the tap and the capacitance from the corresponding first or second capacitor matches the LNA output impedance to a desired load impedance (e.g., 50Ω). The output impedance of the LNA is typically higher so the transformer performs an advantageous impedance matching between the load and the LNA.

The first capacitor couples to a first resonant circuit that is tuned to substantially block RF signals within the second frequency band. A first load (e.g., a mixer and demodulator) may thus receive the amplified version of the first RF signal from an output of the first resonant circuit. Similarly, the second capacitor couples to a second resonant circuit that is tuned to substantially block RF signals within the first frequency band. A second load (e.g., another mixer and demodulator) may then receive the amplified version of the second RF signal from an output of the second resonant circuit. The matching network also comprise a power splitter in some embodiments.

The bypass path may be a transmission line and will have a characteristic impedance (e.g., 50Ω). The broadband LNA disclosed herein has an advantageous impedance matching to the characteristic impedance of the bypass path. This matching exists across both the first frequency band and the second frequency band for broadband performance. To provide a gain tuning ability, the LNA includes a plurality of selectable branches. The greater the number of branches that are selected, the greater the gain for the LNA. Conversely, as the number of branches that are selected is decreased, the lower the gain for the LNA. To perform the impedance matching, the LNA includes an input inductor in series with a DC-blocking capacitor. A terminal of the first inductor forms an input node for the LNA.

Each branch of the LNA includes an input transistor. A terminal of the DC blocking capacitor couples to a gate of each input transistor. Depending upon the amplitude of the RF signal coupling through the serial combination of the first inductor and the DC-blocking capacitor, each selected input transistor will conduct to amplify the carrier-aggregated RF signal accordingly. To increase the bandwidth and improve the impedance matching for various gain settings, each branch includes a degeneration inductor coupled to a source of the branch's input transistor. A drain for each branch's input transistor couples through a cascode transistor to an output node for the LNA. A selective biasing of the cascode transistors selects for the active branches to set the gain. The input inductor magnetically couples to each active branch's degeneration inductor. The resulting LNA has a bandwidth (and hence an input impedance matching) that is substantially stable regardless of the number of active branches. This property occurs because a real part of the input impedance to the LNA is proportional to a product of the transconductance for the active branches and a total inductance for the active degeneration inductors. As the gain goes up with the number of active branches, the transconductance increases. But due to the parallel combination of the degeneration inductors, their total inductance decreases as the number of active branches. The transconductance increase is thus offset by the total degeneration inductance decrease as the gain increases. Conversely, as the gain decreases, the total degeneration inductance increases but the total transconductance decreases. As a result, the input impedance matching is relatively constant over the various gain settings for the LNA. Some example embodiments will now be discussed in more detail.

Figure 1A:
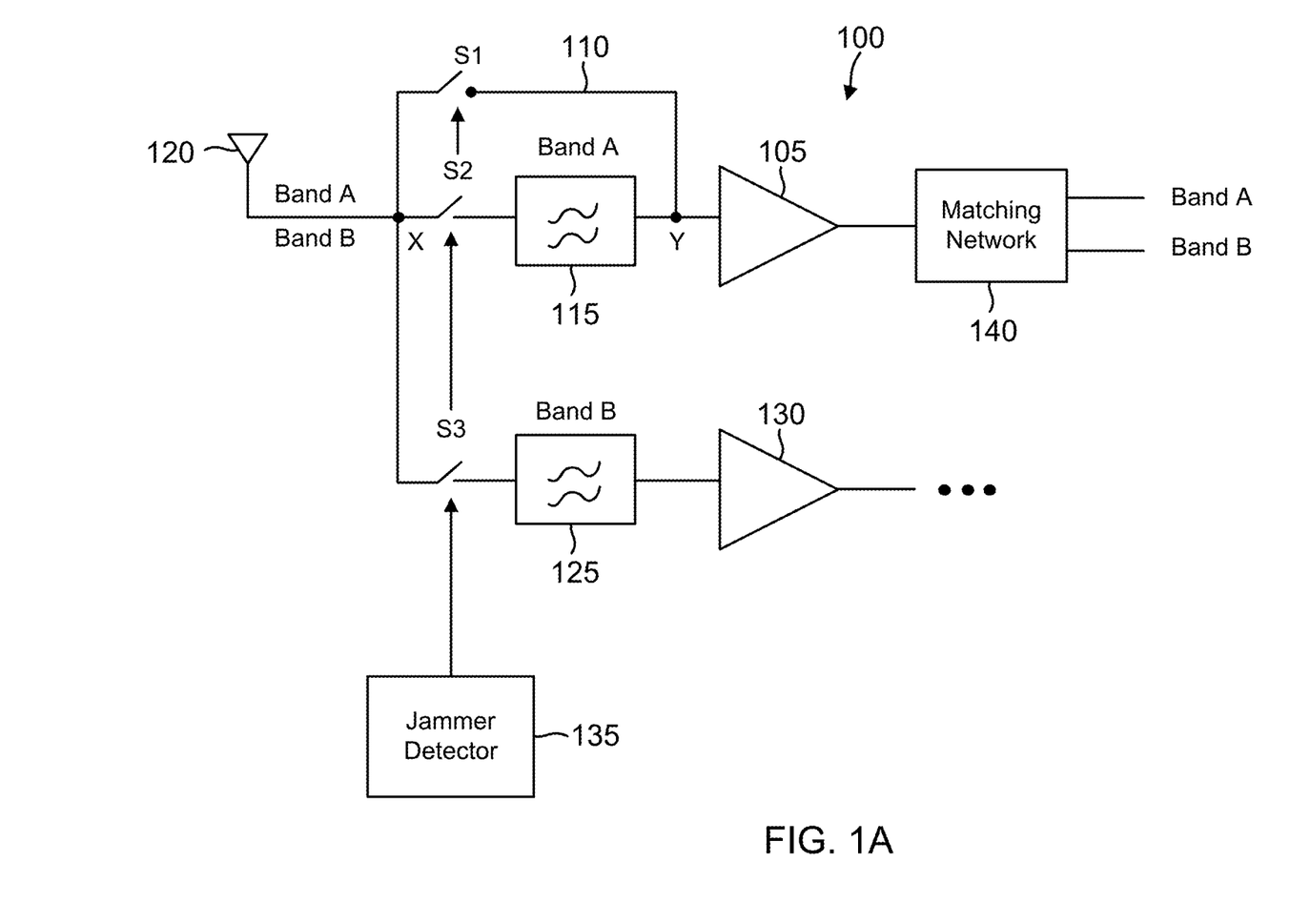
FIG. 1A illustrates a receiver front end in which a broadband LNA functions during both a bypass mode of operation and also during a jammer mode of operation in accordance with an aspect of the disclosure.

An example receiver front end 100 is shown in FIG. 1A. Note that only the elements relevant to the filter bypass for a carrier-aggregation mode of operation are shown in FIG. 1A. During a bypass mode of operation with carrier aggregation, an at least one antenna 120 receives a carrier-aggregated RF signal that is an aggregation of a first RF carrier modulated over a frequency band A and a second RF carrier modulated over a frequency band B. The first RF carrier as modulated over frequency band A is also denoted herein as the first RF signal. Similarly, the second RF carrier as modulated over frequency band B is denoted herein as the second RF signal. Frequency bands A and B are distinct from each other and may be non-contiguous (e.g, as used in non-contiguous inter-band carrier-aggregation scenarios). As noted earlier, it is advantageous to use a single broadband LNA 105 to amplify such a carrier-aggregated RF signal prior to any bandpass filtering. Not only does the use of a single LNA save power but the lack of bandpass filtering improves the noise figure and fidelity of receiver front end 100. But note that a lack of filtering prior to the low-noise amplification would be undesirable in the presence of sufficiently strong interfering signals (referred to herein as jammers or jamming signals).

Receiver front end 100 may thus include a jammer detector 135 configured to detect the presence and absence of jamming signals. To detect the jamming signals, jammer detector 135 may sample the received RF signal such as from a node X adjacent to antenna 120. Alternatively, jammer detector 135 may periodically sample the RF signal at an input node Y to LNA 105. Should jammer detector 135 detect the absence of jamming signals while antenna 120 receives the carrier-aggregated RF signal, jammer detector 135 configures a switch matrix that includes a switch S1, a switch S2, and a switch S3 into a bypass mode configuration. Switch S1 couples between antenna 120 and a bypass path 110 (transmission line) that bypasses a first bandpass filter 115 that selects for frequency band A. Switch S2 couples between antenna 120 and first bandpass filter 115. Finally, switch S3 couples between antenna 120 and a second bandpass filter 125 that selects for band B. In the bypass mode configuration (which may also be denoted as a first configuration) for the switch matrix, switch S1 is closed whereas switches S2 and S3 are open. The carrier-aggregated RF signal thus propagates from antenna 120 over bypass path 110 to low-noise amplifier 105 during the bypass mode of operation. The resulting RF signal from bypass path 110 that drives low-noise amplifier 105 during the bypass mode may also be designated herein as a bypassed RF signal. Low-noise amplifier 105 amplifies the carrier-aggregated RF signal from bypass path 110 to form an amplified RF signal that is received by a matching network 140. Matching network 140 is configured to split the amplified RF signal into an amplified version of the first RF signal in band A and into an amplified version of the second RF signal in band B as will be explained further herein. The separation between bands A and B determines the desired broadband performance for LNA 105. For example, in the Long Term Evolution (LTE) communication protocol, the separation between bands A and B may as wide (or wider than) 800 MHz. In such embodiments, LNA 105 would need to be configured to provide adequate impedance matching across such a relatively wide frequency band.

Jammer detector 135 configures the switch matrix into a second configuration in a jammer mode of operation should jammer detector 135 detect the presence of a jamming signal. In this second configuration, switch S1 is opened whereas switches S2 and S3 are closed. The carrier-aggregated signal thus propagates from antenna 120 through bandpass filter 115 during the jammer mode of operation. Bandpass filter 115 selects for the first RF signal and provides the first RF signal to low-noise amplifier 105. Low-noise amplifier 105 then amplifies the first RF signal to drive an amplified version of the first RF signal through matching network 140. Similarly, the carrier-aggregated RF signal also propagates from antenna 120 through bandpass filter 125 during the jammer mode of operation. Bandpass filter 125 selects for the second RF signal and provides the second RF signal to a low-noise amplifier 130. Low-noise amplifier 130 then amplifies the second RF signal to drive another matching network (not illustrated). Although the second configuration of the switch matrix also results in the amplification of the first and second RF signals, note that bandpass filters 115 and 125 introduce noise and reduce receiver sensitivity. The bypass mode of operation thus advantageously provides a higher signal-to-noise ratio for the amplification of the first and second RF signals. Note that matching network 140 advantageously provides extra filtering for band A in addition to the filtering provided by bandpass filter 115. It will be appreciated that an analogous matching network (not illustrated) may provide additional filtering for the amplified RF signal from LNA 130.

Switches S1, S2, and S3 are ideal switches and thus provide 100% isolation when opened. However, if these switches are implemented as transistor switches, note that a transistor switch does not satisfy such ideal switch behavior such that some signal power will transmit through an opened transistor switch. Such power leakage across a transistor switch can be problematic, particularly in the presence of a jamming signal. For example, suppose that jammer detector 135 detects the presence of a jamming signal while antenna 120 receives a carrier-aggregated RF signal. As discussed above, switches S2 and S3 would then be closed whereas switch S1 would be opened. But a relatively strong jamming signal could leak across closed switch S1 to affect the amplified RF signal produced by LNA 105. It would thus be advantageous to implement switch S1 as a series of transistor switches so that the leakage of the jamming signal could be reduced to relatively harmless levels. Conversely, switches S2 and S3 are opened during the bypass mode of operation with carrier aggregation. To prevent leakage through bandpass filter A from affecting the amplified RF signal, another transistor switch (not illustrated) may be inserted between the output of bandpass filter A and the input to LNA 105. In one embodiment, switches S1, S2, and bypass path 110 may be deemed to form a means for bypassing bandpass filter 115 during a bypass mode of operation and for coupling bandpass filter 115 to an LNA when the bypass mode of operation is not active.

Although the bypass mode of operation is advantageous with carrier aggregation, note that there are embodiments in which the bypass mode of operation may be invoked despite the absence of carrier aggregation. In this fashion, the insertion loss and reduced receiver sensitivity from bandpass filter A would still be avoided. Matching network 140 would then function to provide the desired single band frequency selection.

Figure 1B:
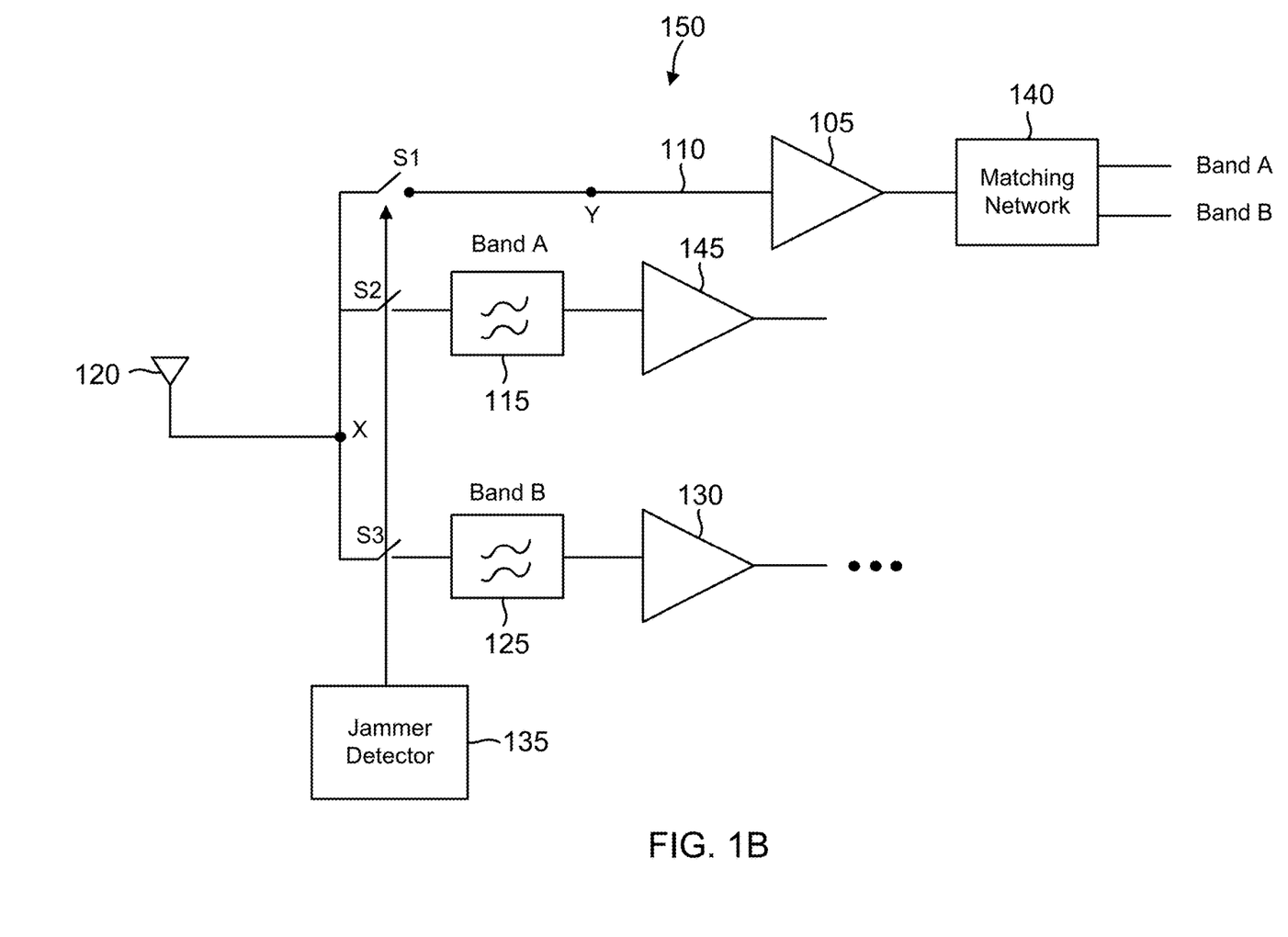
FIG. 1B illustrates a receiver front end in which a broadband LNA functions only during a bypass mode of operation in accordance with an aspect of the disclosure.

An alternative receiver front end 150 is shown in FIG. 1B in which broadband LNA 105 is dedicated to the bypass mode of operation. Bandpass filter 115 thus drives an LNA 145 whereas bandpass filter 125 drives LNA 130. Since LNA 130 and LNA 145 are not used while antenna 120 receives a carrier-aggregated RF signal during the bypass mode, each of these LNAs may be relatively narrow band as compared to broadband LNA 105. In other words, LNA 145 may merely provide impedance matching at frequency band A. Similarly, LNA 130 may merely provide impedance matching at frequency band B. In contrast, broadband LNA 105 provides impedance matching at both of these frequency bands. During carrier aggregation operation, jammer detector 135 may invoke the bypass mode of operation in the absence of a jamming signal by closing switch S1 and opening switches S2 and S3. Since broadband LNA 105 would only be used during bypass mode, switch S1 may be implemented using a single transistor switch (not illustrated) so as to improve the noise figure. When switch S2 is opened during the bypass mode of operation, bandpass filter 115 is isolated from antenna 120. In the presence of a jamming signal, switches S2 and S3 are closed whereas switch S1 is opened.

Figure 2:
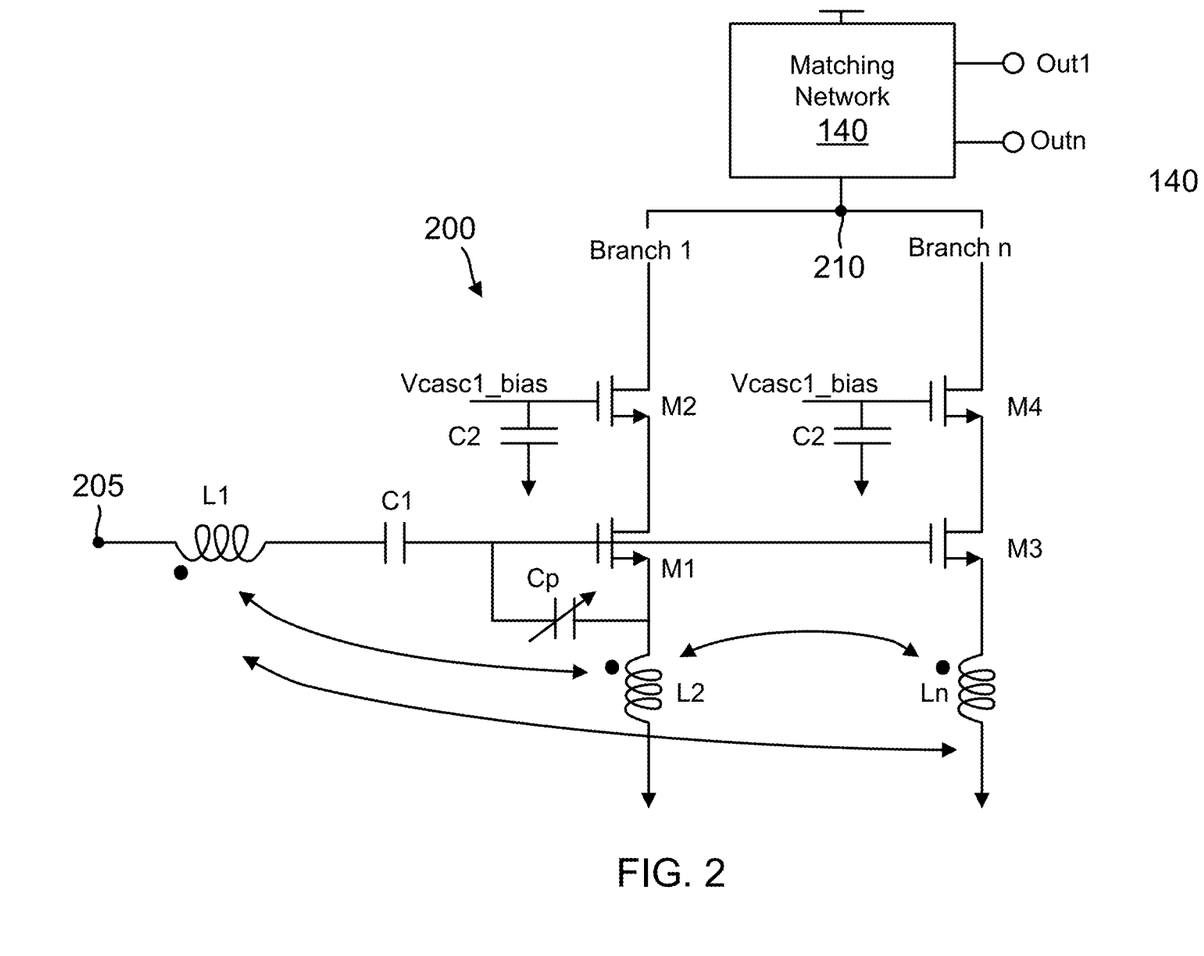
FIG. 2 is a circuit diagram for a broadband low-noise amplifier embodiment for the receiver front end of FIGS. 1A and 1B.

A broadband configuration for low-noise amplifier 105 is disclosed to amplify over both frequency band A and frequency band B. Although any suitable broadband low-noise amplifier architecture may be used to form low-noise amplifier 105, a particularly advantageous broadband configuration 200 for low-noise amplifier 105 is shown in FIG. 2. Low-noise amplifier 200 includes a plurality of n branches, ranging from a first branch (Branch 1) to an nth branch (Branch n). The number of active ones of these branches determines the gain for low-noise amplifier 200. At a lowest gain setting, only one branch (e.g., Branch 1) is active whereas at a highest gain setting all the n branches are active.

Each branch includes an input transistor. For example, Branch 1 includes an input transistor M1 whereas Branch n includes an input transistor M3. As illustrated, input transistors M1 and M3 are n-type metal-oxide semiconductor (NMOS) transistors although an equivalent broadband implementation of low-noise amplifier 200 may be constructed using p-type metal-oxide semiconductor (PMOS) transistors. Depending upon the mode of operation, an RF signal to be amplified is received at an input node 205 for low-noise amplifier 200. In the bypass configuration, the received RF signal would be the carrier-aggregated RF signal whereas the received RF signal would be the first RF signal in presence of a jamming signal. Regardless of the mode of operation, the received RF signal couples through a DC-blocking capacitor C1 to drive the gates of the input transistors in the active branches. Depending upon the amplitude for the received RF signal, the drain of each active input transistor will conduct a corresponding current. To control which branch is active, the drain of each input transistor couples through a corresponding cascode transistor to an output node 210 for low-noise amplifier 200. For example, the drain of input transistor M1 in Branch 1 couples through an NMOS cascode transistor M2 to output node 210. Similarly, the drain of input transistor M3 in Branch n couples through an NMOS cascode transistor M4 to output node 210. A bias voltage (Vcasc1_bias) such as smoothed on a corresponding capacitor C1 is applied to the gate of the cascode transistors in the active branches. In contrast, the cascode transistor in each inactive branch is turned off by grounding its gate. In alternative embodiments, cascode transistor M2 and cascode transistor M4 may each be implemented using a serial pair (not illustrated) of cascode transistors.

To increase the input matching for low-noise amplifier 200 at both frequency band A and frequency band B, the source of each input transistor couples to ground through a corresponding degeneration inductor or coil. For example, the source of input transistor M1 couples to ground through a degeneration inductor L2. Similarly, the source of input transistor M3 couples to ground through a degeneration inductor Ln. Each degeneration inductor is magnetically coupled with an input inductor L1. Input node 205 couples to DC-blocking capacitor C1 through input inductor L1. For example, input inductor L1 may be formed as a first coil in a first metal layer adjacent to a semiconductor die incorporating the active devices for receiver front end 100. Degeneration inductor L2 would then be formed as second coil in a neighboring metal layer to the first metal layer. A center axis for the first coil is aligned with a center axis for the second coil so that the coils are magnetically coupled. The remaining degeneration inductors such as degeneration inductor Ln would be formed analogously. The on-chip integration of input inductor L1, the transconductance for the input transistors in the active branches, and the inductance for the degeneration inductors advantageously increases the operating bandwidth for low-noise amplifier 200. A resulting amplified RF signal exits output node 210 to drive matching network 140. To provide additional tuning, a corresponding variable capacitor may couple between the gate and source of each input transistor. For example, a variable capacitor Cp couples between the gate and source for input transistor M1.

Figure 3A:
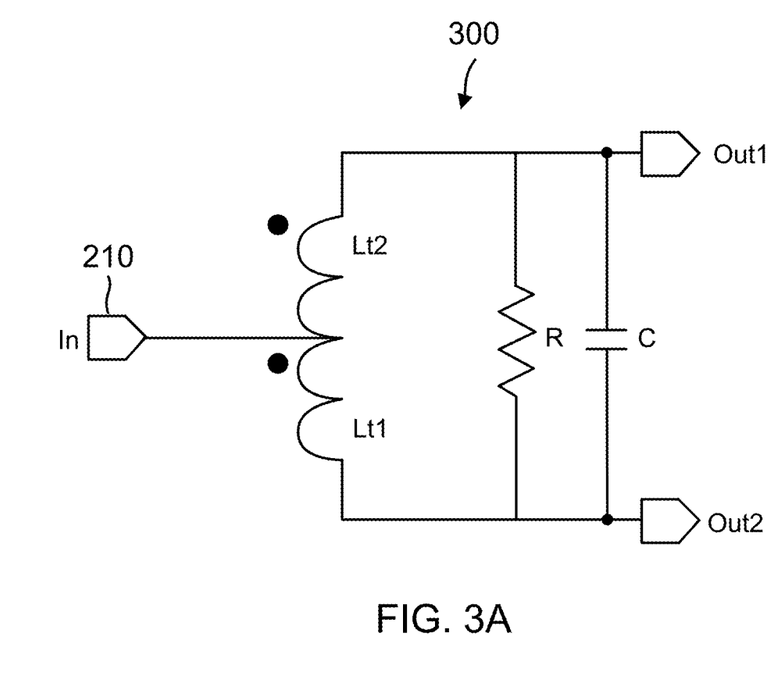
FIG. 3A is a circuit diagram of a power splitter embodiment for a matching network in accordance with an aspect of the disclosure.

Matching network 140 may be implemented in a variety of different embodiments. To match the output impedance of low-noise amplifier 105 to the desired value, matching network 140 may incorporate a transformer having a primary winding and a secondary winding. Alternatively, the transformer may be implemented as an autotransformer. In other embodiments, an LC choke may provide the impedance matching. In addition, matching network 140 may comprise a power splitter 300 as shown in FIG. 3A. An input node (In) couples to the output node 210 (FIG. 2) of broadband low-noise amplifier 200 and drives an autotransformer having a coil Lt1 coupled to a coil Lt2. A terminal for coil Lt2 coupes to a first output node (Out1). Similarly, a terminal for coil Lt1 coupes to a second output node (Out2). A resistor R and a capacitor C couple in parallel between the two output nodes. Power splitter 300 functions to split the amplified RF signal from broadband low-noise amplifier 200 into amplified versions of the first RF signal and of the second RF signal. For example, the amplified version of the first RF signal may drive out through the first output node whereas the amplified version of the second RF signal may drive out the second output node. The frequency response for power splitter 300 depends upon the inductances for coils Lt1 and Lt2, the capacitance for capacitor C, and the resistance for resistor R. In one embodiment, the frequency response for power splitter 300 may be centered around one of the frequency bands (either band A or band B). But the gain for the remaining band would then be fairly low. To provide a substantially equal gain for each RF signal, the frequency response for power splitter 300 may thus be centered between frequency bands A and B. For example, in various embodiments, frequency bands A and B may each be a first Long Term Evolution (LTE) band. In a particular embodiment, frequency band A may be LTE band 41 (centered at 2.6 GHz) whereas frequency band B may be LTE band 39 (centered at 1.9 GHz). In such an embodiment, the frequency response for power splitter 300 may be centered at 2.25 GHz, the midpoint of the 700 MHz separating the two frequency bands. The gain through broadband low-noise amplifier 200 would thus reach a maximum value at this centered frequency and be reduced for the frequency bands A and B. A variable capacitor Ctune couples between input node 210 and ground (or the power supply voltage VDD) to provide additional tuning for autotransformer 320. Similarly, a variable resistor Rp couples between input node and a power supply node for autotransformer 320.

Figure 3B:
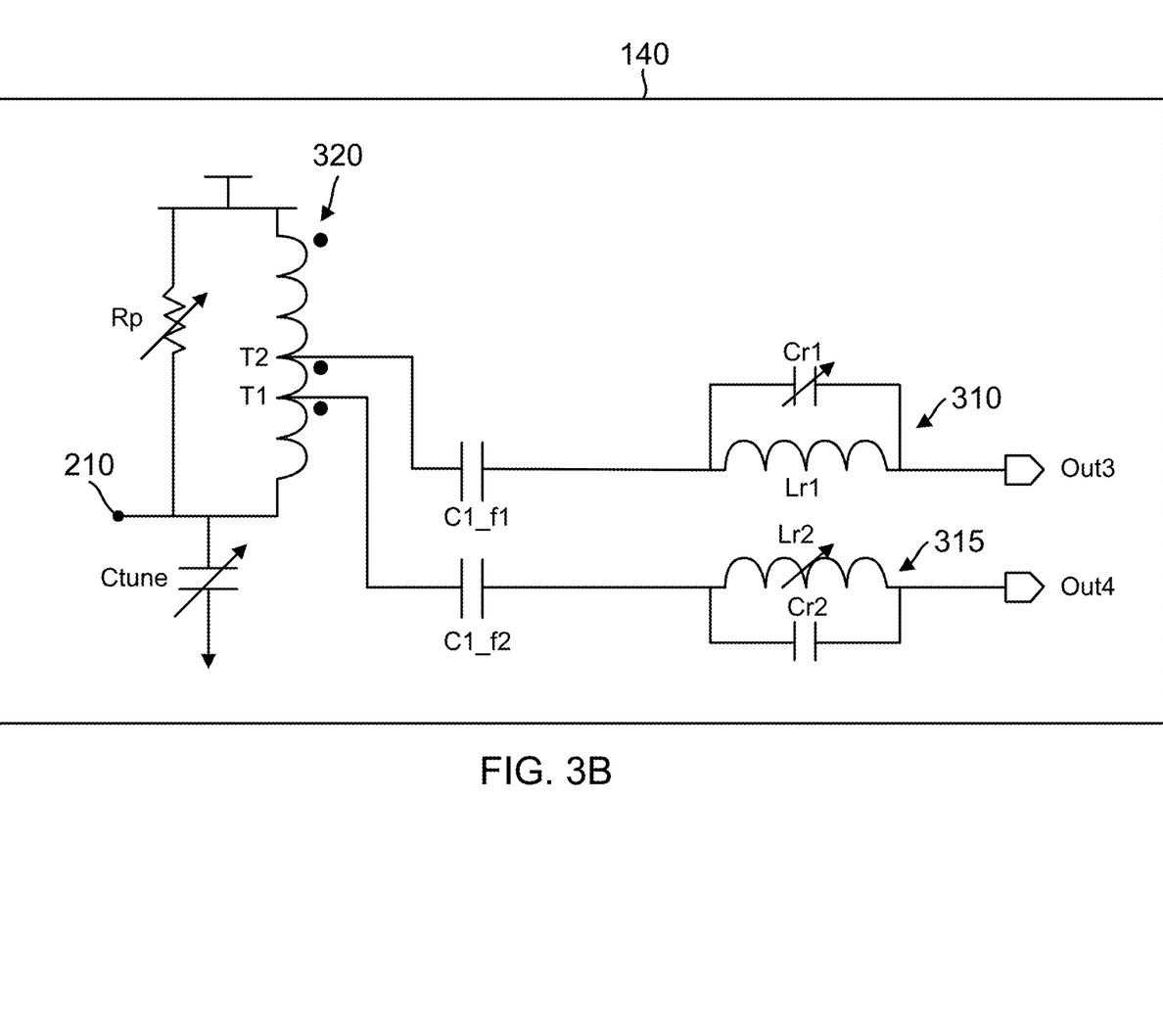
FIG. 3B is a circuit diagram of a resonant circuit embodiment for a matching network in accordance with an aspect of the disclosure.

But even with a centered frequency response, power splitter 300 introduces at least a 3 dB loss in the amplified versions of the first and second RF signals as compared to the amplified version of the carrier-aggregated RF signal produced by broadband low-noise amplifier 200 during a bypass mode of operation. In practice, this loss may be as much as 7 dB or the like. To provide increased signal power, matching network 140 may be implemented as shown in FIG. 3B. Output node 210 couples to input of an autotransformer 320 having a tap T1 and a tap T2. Tap T1 couples through a capacitor C1_f2 a resonant circuit 315. Similarly, tap T2 couples through a capacitor C1_f1 to a resonant circuit 310. Note that an output impedance for broadband low-noise amplifier 200 is relatively high. In contrast, the input impedance for down-chain components from receiver front end 100 is relatively low (e.g., 50Ω). The impedances for tap T1, capacitor C1_f2 and resonant circuit 315 matches the output impedance for broadband low-noise amplifier 200 to the desired output impedance (e.g., 50Ω) at an output terminal (Out4) for resonant circuit 315 at the center frequency for frequency band B. Resonant circuit 315 may be implemented as a parallel inductor-capacitor (LC) circuit such as formed through an inductor Lr2 and a capacitor Cr2 but it will be appreciated that other types of resonant circuit topologies may be used. Resonant circuit 315 is configured to present a high impedance to frequency band A so that it predominately just the amplified version of the second RF signal that drives out from output node Out4 during the bypass mode of operation.

Analogous to resonant circuit 315, resonant circuit 310 may be implemented as a parallel LC circuit as formed using an inductor Lr1 and a capacitor C1. The impedances for tap 2, capacitor C1_f1, and resonant circuit 310 match the output impedance for broadband low-noise amplifier 200 to the desired output impedance for frequency band A at an output node Out3. Resonant circuit 310 presents a relatively high impedance to frequency band B. As compared to power splitter 300, the use of resonant circuits 310 and 315 introduce substantially lower loss (e.g., less than 3 dB as compared to 7 dB or more for power splitter 300 for a relatively wide separation between frequency bands A and B such as 800 MHz). The loss of each resonant circuit depends upon its quality factor. Due to the selection by the resonant circuits, the gain through broadband low-noise amplifier 200 peaks at frequency band A and also at frequency band B. In contrast, the gain through broadband low-noise amplifier 200 would reach its maximum at the centered frequency and be reduced for frequency bands A and B when broadband low-noise amplifier 200 drives power splitter 300 as discussed above.

The resonant frequency for a parallel LC circuit such as shown for resonant circuits 310 and 315 is proportional to 1/Sqrt(LC). To provide an ability to tune the resonant frequency, the capacitance and/or the inductance in each parallel LC circuit may be tunable. For example, the capacitance for capacitor Cr1 may be variable. Similarly, the inductance for inductor Lr2 may be variable. Depending upon the tuning, the resonant frequency for each resonant circuit may be adjusted to select for the desired frequency band.

Note that the resonant circuits 310 and 315 are also useful when the bypass mode is not active. For example, suppose that frequency band A is the B41 LTE band and that frequency band B is the B25 LTE band. If the bypass mode is not active, bandpass filter 115 would select for the B41 band for RF front end 100 of FIG. 1A. Although the B25 band had already been substantially blocked by bandpass filter 115, resonant circuit 310 may still provide useful additional filtering to select for the B41 band and to reject the B25 band in such a scenario.

Figure 4A:
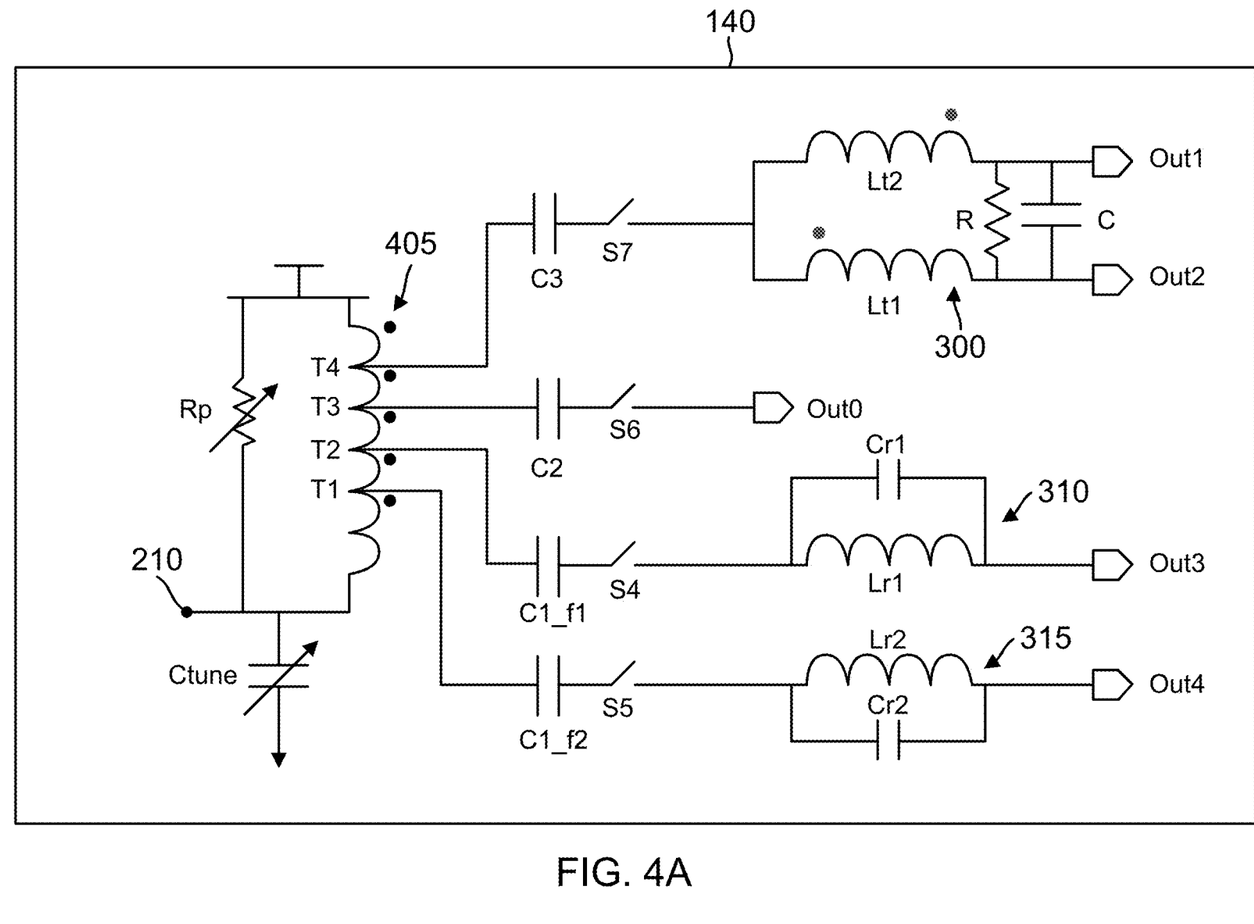
FIG. 4A is a circuit diagram of a matching network embodiment that includes a power splitter and a pair of resonant circuits in accordance with an aspect of the disclosure.

Alternative embodiments for matching network 140 may include power splitter 300 as well as resonant circuits 310 and 315 such as shown in FIG. 4A. An autotransformer 405 includes taps T1 and T2 but also includes a tap T3 and a tap T4. Tap 4 couples through a capacitor C3 and a switch S7 to power splitter 300. Switch S7 would then be closed if operation with power splitter 300 was desired. Similarly, tap T3 couples through a capacitor C2 and a switch S6 to drive an output node Out0. Switch S6 may then be closed during a mode of operation in which only output matching but no frequency filtering is desired. Variable capacitor Ctune and a variable resistor Rp are arranged as discussed with regard to autotransformer 320. To select for operation with resonant circuit 310, a switch S4 couples between capacitor C1_f1 and resonant circuit 310. Similarly, a switch S5 couples between resonant circuit 3154 and capacitor C1_f2. It will be appreciated that various sub-combinations of the taps may be implemented in alternative embodiments. For example, tap3 and/or tap4 may be deleted in alternative embodiments.

Figure 4B:
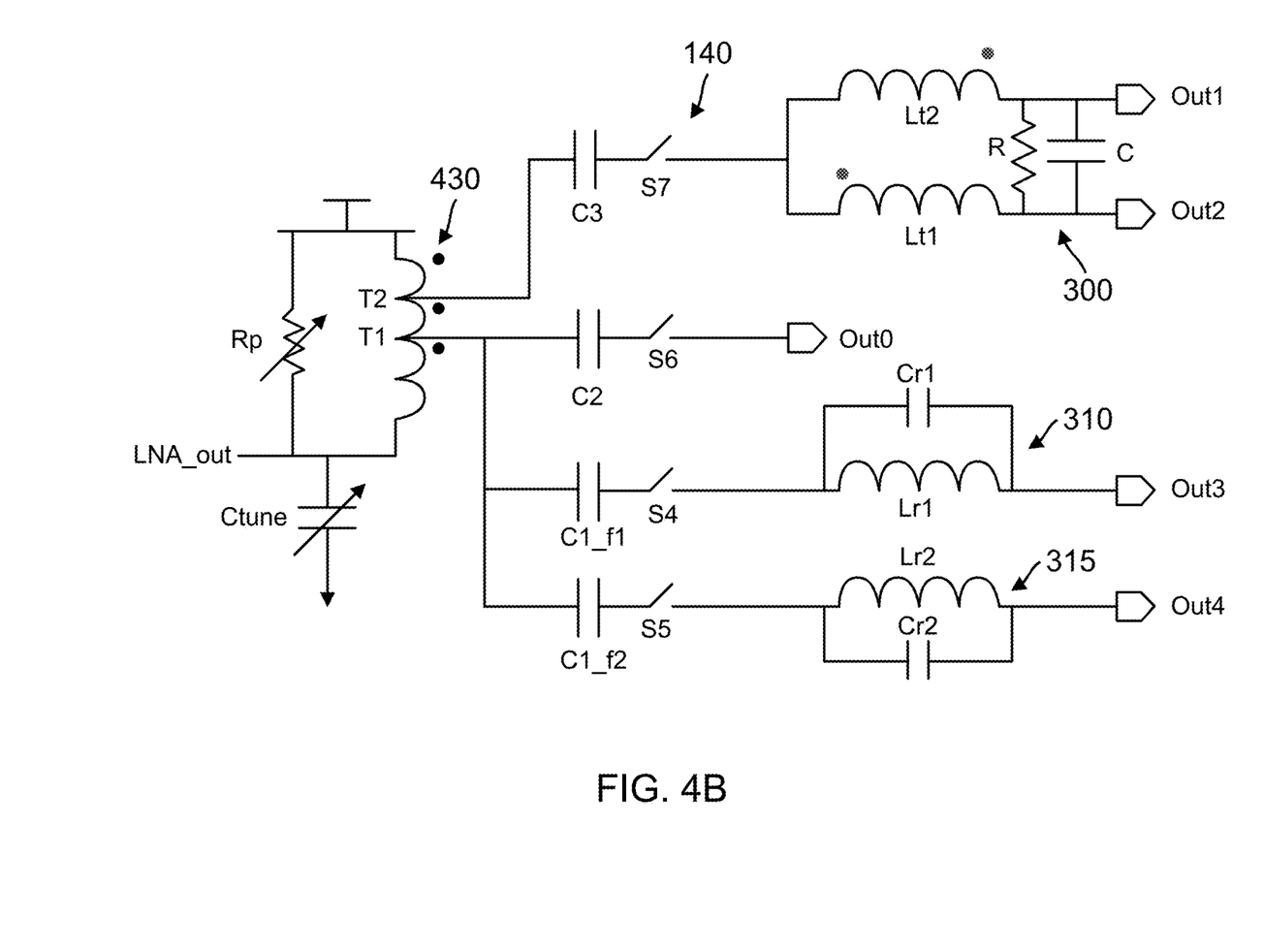
FIG. 4B is a circuit diagram of a matching network embodiment that includes a power splitter and a pair of resonant circuits in accordance with an aspect of the disclosure.

An embodiment for matching network 140 in which an autotransformer 430 includes just a pair of taps T1 and T2 is shown in FIG. 4B. Tap T1 couples through capacitor C1_f1 and switch S4 to resonant circuit 310 and also couples through capacitor C1_f2 and switch S5 to resonant circuit 315. But tap T1 also couples through capacitor C2 and switch S6 to output 0. Tap 2 couples through capacitor C3 and switch S7 to power splitter 300.

Figure 4C:
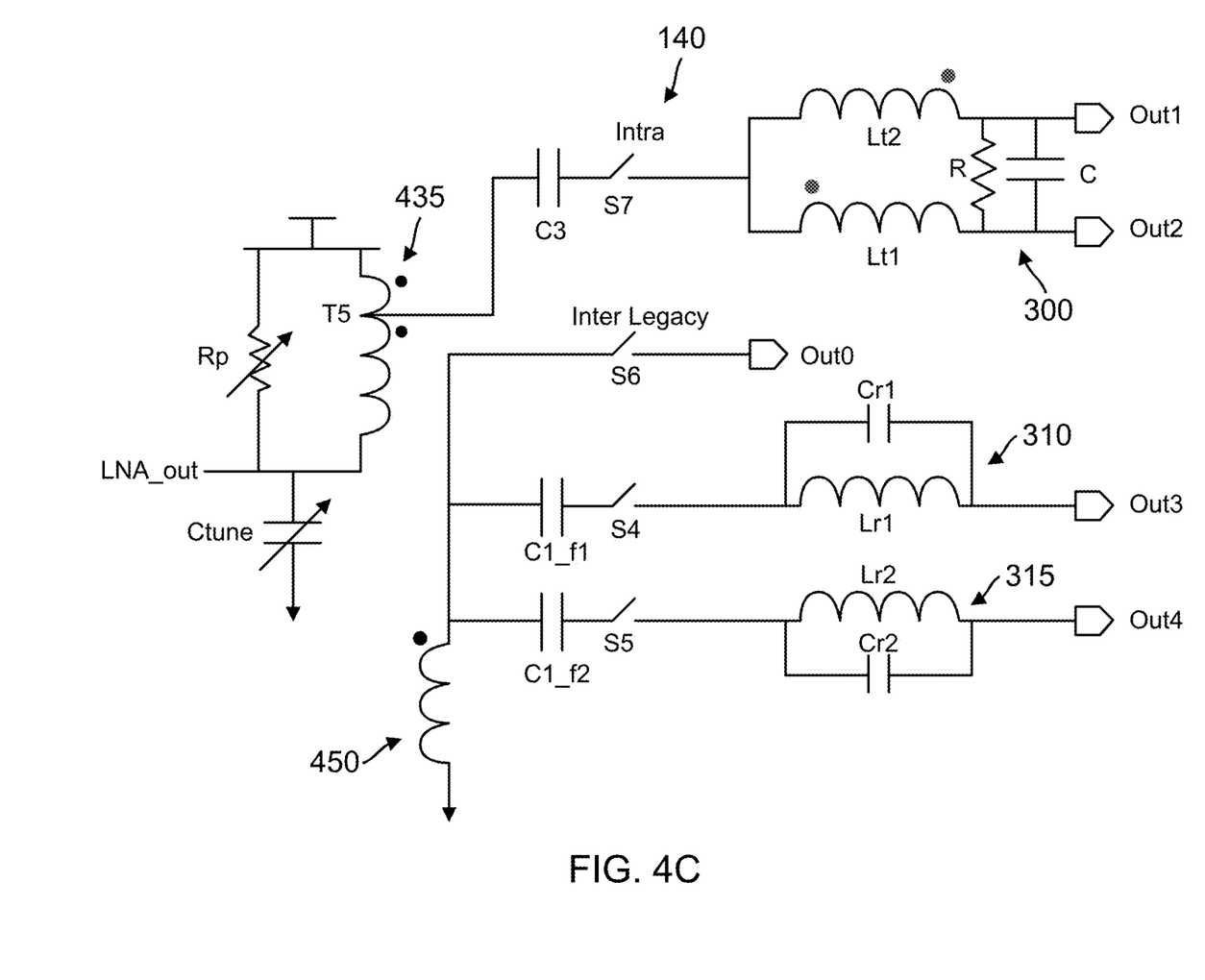
FIG. 4C is a circuit diagram of a matching network embodiment that includes a power splitter and a pair of resonant circuits in accordance with an aspect of the disclosure.
Figure 4D:
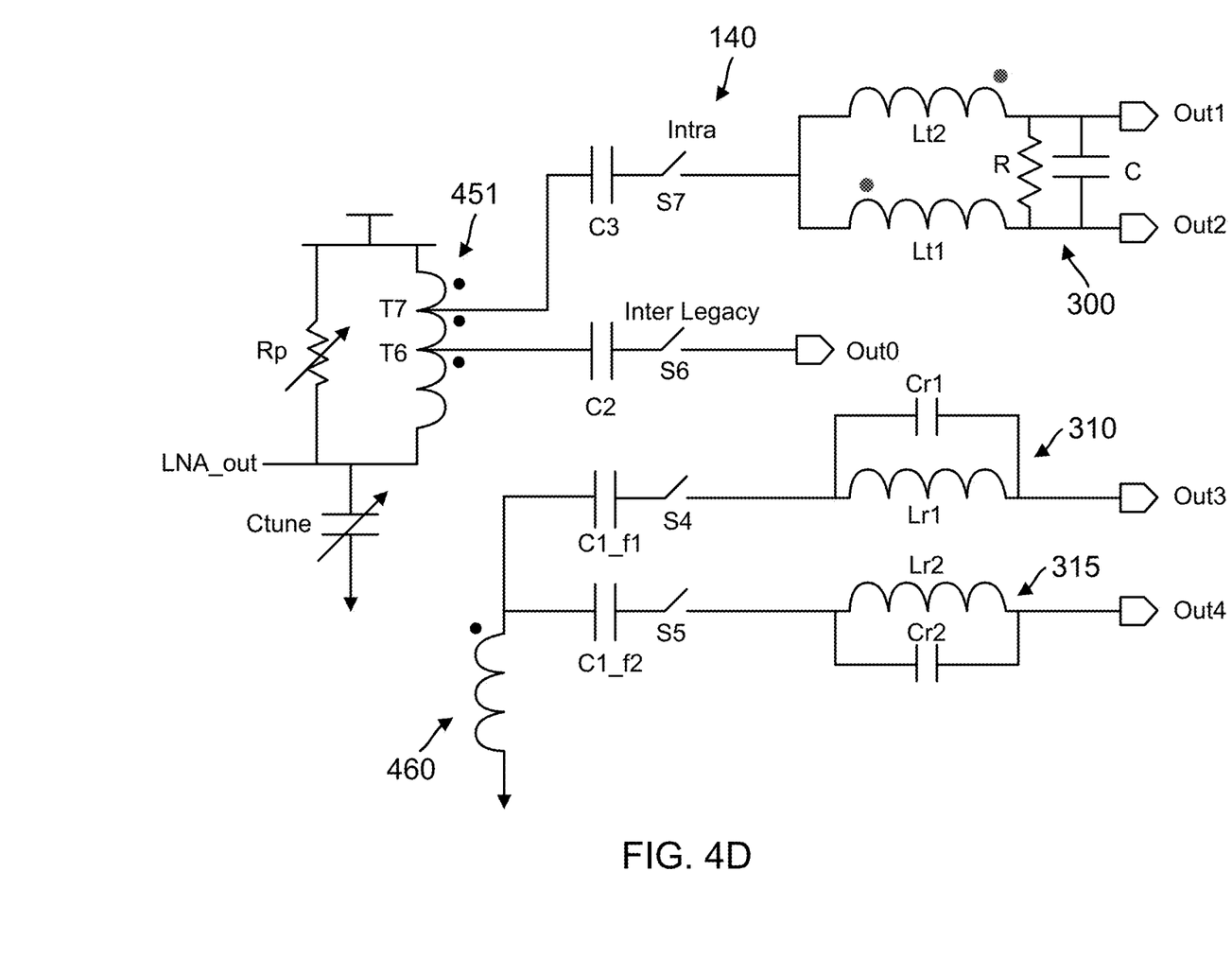
FIG. 4D is a circuit diagram of a matching network embodiment that includes a power splitter and a pair of resonant circuits in accordance with an aspect of the disclosure.

The transformer in matching network 140 may include a primary winding 435 and a secondary winding 450 such as shown in FIG. 4C. Secondary winding 450 couples to resonant circuits 310 and 315 and output 0 analogously as discussed with regard to tap T1 in FIG. 4B. Primary winding 435 in turn functions as an autotransformer with respect to a tap T5 that functions analogously to tap T2 as discussed in FIG. 4B. Alternatively, a secondary winding 460 as shown for a matching network 140 in FIG. 4D may only couple to resonant circuits 310 and 315 as opposed to also coupling to output 0. In FIG. 4D, a primary winding 451 also functions as an autotransformer with respect to a tap T6 and a tap T7. Tap T6 functions as the equivalent of tap T3 in FIG. 4A. Similarly, tap T7 functions as the equivalent of tap T4 in FIG. 4A. Variable capacitor Ctune and variable capacitor Rp provide additional tuning for primary windings 450, 451, and 430.

Figure 5:
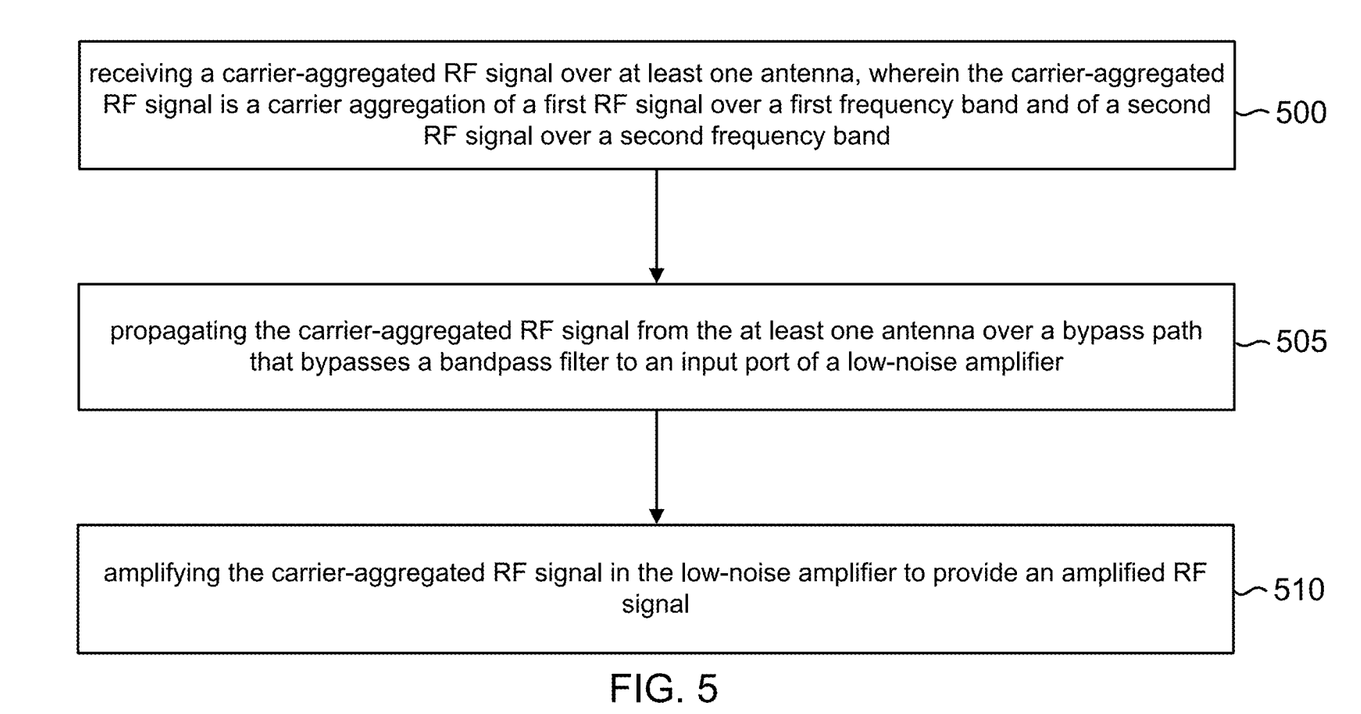
FIG. 5 is a flowchart for a method of operation for a receiver front end in accordance with an aspect of the disclosure.

A method of operation for a receiver front end as disclosed herein will now be discussed with reference to the flowchart of FIG. 5. The method includes an act 500 of receiving a carrier-aggregated RF signal over at least one antenna, wherein the carrier-aggregated RF signal is a carrier aggregation of a first RF signal in a first frequency band and of a second RF signal in a second frequency band.

The receipt of the carrier-aggregated RF signal at antenna 120 is an example of act 500. The method further includes an act 505 of propagating the carrier-aggregated RF signal from the at least one antenna over a bypass path that bypasses a bandpass filter to drive an input port of a broadband low-noise amplifier. The propagation of the carrier-aggregated RF signal over bypass path 110 during the bypass mode of operation is an example of act 505. Finally, the method includes an act 510 of amplifying the carrier-aggregated RF signal in the broadband low-noise amplifier to provide an amplified RF signal. The amplification through broadband low-noise amplifier 200 is an example of act 510.

Figure 6:
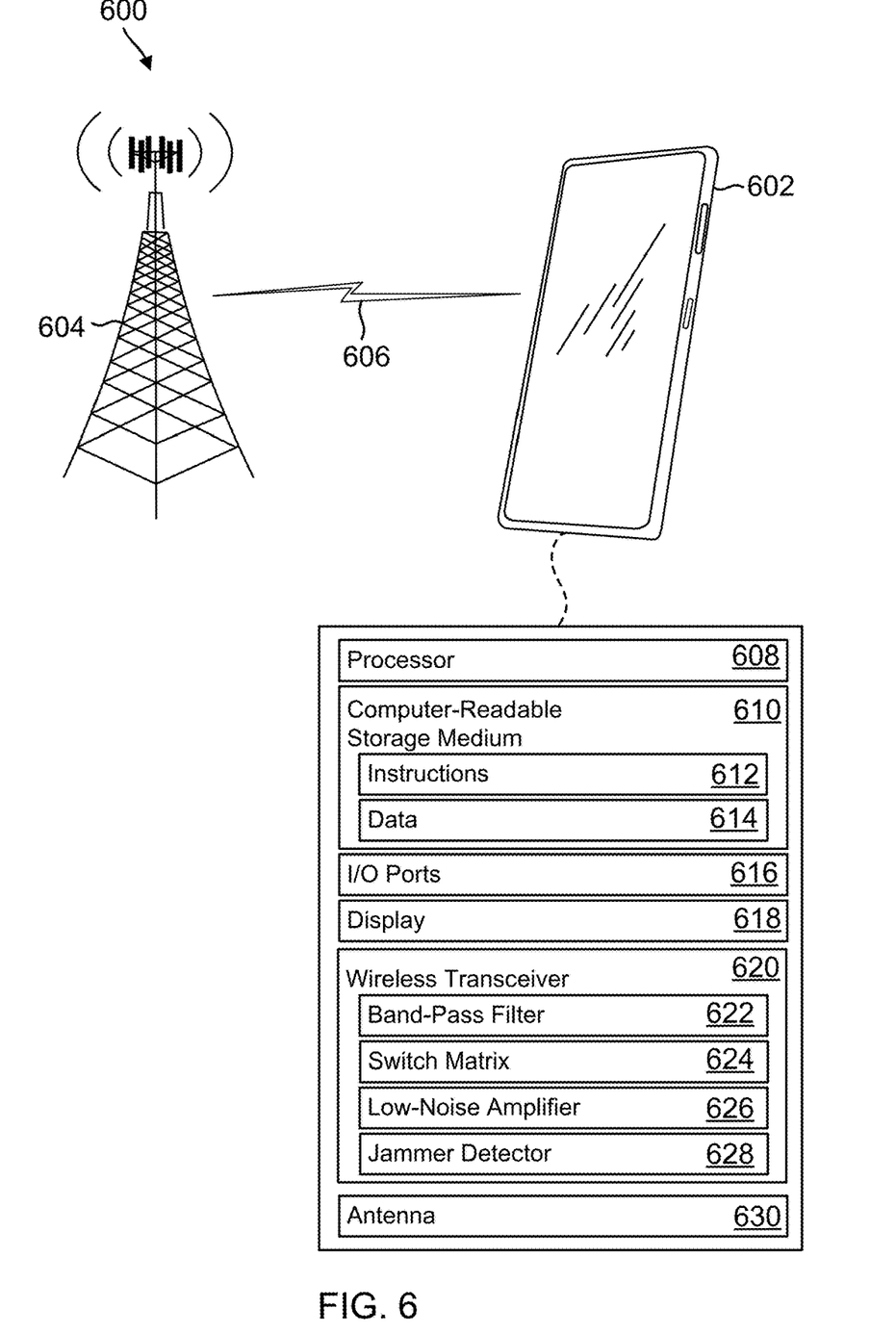
FIG. 6 illustrates an example cellular phone including a receiver front end in accordance with an aspect of the disclosure.

FIG. 6 illustrates an example environment 600 including a cellular telephone 602 that communicates with a base station 604 through a wireless link 606 using a receiver front end as disclosed herein. Base station 604 communicates with cellular telephone 602 via the wireless link 606, which may be implemented as any suitable type of wireless link. Although depicted as a tower of a cellular network, base station 604 may represent or be implemented as another device, such as a satellite, cable television head-end, terrestrial television broadcast tower, access point, peer-to-peer device, mesh network node, fiber optic line, and so forth.

Wireless link 606 can include a downlink of data or control information communicated from the base station 604 to cellular telephone 602 and an uplink of other data or control information communicated from cellular telephone 602 to base station 604. Wireless link 606 may be implemented using any suitable communication protocol or standard, such as 3rd Generation Partnership Project Long-Term Evolution (3GPP LTE), 5th Generation (5G), IEEE 802.11, IEEE 802.16, Bluetooth™, and so forth.

As illustrated, cellular telephone 602 includes at least one processor 608 and at least one computer readable storage medium 610 (CRM 610). Processor 608 may include any type of processor, such as an application processor or multi-core processor, that is configured to execute processor-executable code stored by CRM 610. CRM 610 may include any suitable type of data storage media, such as volatile memory (e.g., random access memory (RAM)), non-volatile memory (e.g., Flash memory), optical media, magnetic media (e.g., disk or tape), and so forth. In the context of this disclosure, CRM 610 is implemented to store instructions 612, data 614, and other information of cellular telephone 602, and thus does not include transitory propagating signals or carrier waves.

Cellular telephone 602 may also include input/output ports 616 (I/O ports 616) and a display 618. I/O ports 616 enable data exchanges or interaction with other devices, networks, or users. I/O ports 616 may include serial ports (e.g., universal serial bus (USB) ports), parallel ports, audio ports, infrared (IR) ports, and so forth. Display 618 presents graphics of cellular telephone 602, such as a user interface associated with an operating system, program, or application. Alternately or additionally, display 618 may be implemented as a display port or virtual interface, through which graphical content of cellular telephone 602 (e.g. a smartphone).

A wireless transceiver 620 of cellular telephone 602 provides connectivity to respective networks and other electronic devices connected therewith. Alternately or additionally, cellular telephone 602 may include a wired transceiver, such as an Ethernet or fiber optic interface for communicating over a local network, intranet, or the Internet. Wireless transceiver 620 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of example environment 600, the wireless transceiver 620 enables cellular telephone 602 to communicate with the base station 604 and networks connected therewith.

Wireless transceiver 620 includes circuitry and logic, such as filters, switches, amplifiers, mixers, and so forth, for conditioning signals that are transmitted or received via at least one antenna 630. Wireless transceiver 620 may also include logic to perform in-phase/quadrature-phase (I/Q) operations, such as synthesis, encoding, modulation, decoding, demodulation, and so forth. In some cases, components of wireless transceiver 620 are implemented as separate receiver and transmitter entities. Additionally, or alternatively, wireless transceiver 620 can be realized using multiple or different sections to implement respective receiving and transmitting operations (e.g., separate receive and transmit chains). Wireless transceiver 620 also includes a baseband modem (not shown) to process data and/or signals associated with communicating data of cellular telephone 602 over the antenna 630. The baseband modem may be implemented as a system on-chip (SoC) that provides a digital communication interface for data, voice, messaging, and other applications of cellular telephone 602. The baseband modem may also include baseband circuitry to perform high-rate sampling processes that can include analog-to-digital conversion, digital-to-analog conversion, gain correction, skew correction, frequency translation, and so forth.

As shown, wireless transceiver 620 includes at least one bandpass filter 622, at least one switch matrix 624, and at least one low-noise amplifier (LNA) 626. Bandpass filter 622 is an example of bandpass filters 115 or 125. Bandpass filter 622 can be implemented with acoustic resonators, such as surface acoustic wave (SAW) resonators or bulk-acoustic wave (BAW) resonators, an any other suitable filtering. Switch matrix 624 includes the switches discussed above. Similarly, a low-noise amplifier 626 represents broadband LNA 105 as well as LNAs 130 and 145 discussed above. Finally, transceiver 620 includes a jammer detector 628.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A receiver front end, comprising:
a first bandpass filter configured to filter a received radio-frequency (RF) signal to provide a filtered RF signal within a first frequency band;
a bypass path configured to bypass the first bandpass filter with the received RF signal to provide a bypassed RF signal;
a first low-noise amplifier configured to amplify an input RF signal into an amplified RF signal;
a switch matrix having a first configuration in which the input RF signal is the filtered RF signal and having a second configuration in which the input RF signal is the bypassed RF signal, and
a matching network coupled to an amplifier output node for the first low-noise amplifier, the matching network being configured to select for the first frequency band to drive a matching network first output node and being configured to select for a second frequency band to drive a matching network second output node.

2. The receiver front end of claim 1, wherein the matching network is configured such that the second frequency band is not contiguous with the first frequency band.

3. The receiver front end of claim 1, wherein the first frequency band is a first Long Term Evolution (LTE) frequency band, and wherein the second frequency band is a second LTE frequency band.

4. The receiver front end of claim 1, further comprising a jammer detector configured to control the switch matrix to be in the first configuration in response to a detection of a jamming signal and to control the switch matrix to be in the second configuration in response to an absence of the jamming signal.

5. The receiver front end of claim 1, wherein the matching network comprises:
a first resonant circuit configured to be resonant to RF signals within the second frequency band; and
a second resonant circuit configured to be resonant to RF signals within the first frequency band.

6. The receiver front end of claim 1, wherein the first low-noise amplifier is configured to provide a matching input impedance over the first frequency band and over the second frequency band.

7. The receiver front end of claim 6, wherein the first low-noise amplifier comprises:
an input coil having a first terminal configured to receive the input RF signal;
a first input transistor having a drain coupled to the amplifier output node;
a DC-blocking capacitor coupled between a second terminal of the input coil and a gate of the first input transistor; and
a first degeneration coil coupled to a source of the first input transistor, the first degeneration coil being magnetically coupled with the input coil.

8. The receiver front end of claim 7, wherein the first low-noise amplifier further comprises a first cascode transistor coupled between the drain of the first input transistor and the amplifier output node.

9. The receiver front end of claim 7, wherein the first input transistor and the first degeneration coil are configured to form a first branch for the first low-noise amplifier, the first low-noise amplifier further including a second branch comprising:
a second input transistor having a gate coupled through the DC-blocking capacitor to the second terminal of the input coil and having a drain coupled to the amplifier output node; and
a second degeneration coil coupled to a source of the second input transistor, wherein the second degeneration coil is magnetically coupled with the input coil.

10. The receiver front end of claim 1, wherein the matching network comprises an RF power splitter.

11. The receiver front end of claim 1, wherein the matching network comprises an autotransformer.

12. The receiver front end of claim 1, wherein the matching network comprises a transformer including a primary winding and a secondary winding.

13. The receiver front end of claim 11, wherein the matching network further comprises:
a first capacitor coupled between a first tap for the autotransformer and the matching network first output node;
a second capacitor coupled between a second tap for the autotransformer and the matching network second output node;
a first resonant circuit coupled between the first capacitor and the matching network first output node, wherein the first resonant circuit is configured to be resonant to RF signals within the second frequency band; and
a second resonant circuit coupled between the second capacitor and the matching network second output node, wherein the second resonant circuit is configured to be resonant to RF signals within the first frequency band.

14. The receiver front end of claim 13, wherein the first resonant circuit and the second resonant circuit each comprises a parallel inductor-capacitor (LC) circuit.

15. The receiver front end of claim 1, wherein the receiver front end is integrated into a wireless transceiver for a cellular telephone.

16. The receiver front end of claim 1, further comprising:
a second bandpass filter configured to filter the received radio-frequency (RF) signal to provide a bandpass-filtered RF signal within a second frequency band;
a second low-noise amplifier configured to amplify the bandpass-filtered RF signal, wherein the switch matrix comprises a first switch coupled between an at least one antenna and an input to the bypass path; a second switch coupled between the at least one antenna and an input to the first bandpass filter, and a third switch coupled between the at least one antenna and an input to the second bandpass filter, wherein in the first configuration the first switch is closed and the second switch and the third switch are both open, and wherein in the second configuration the first switch is open and the second switch and the third switch are both closed.

17. A method of operation for a receiver front end, comprising:
receiving a carrier-aggregated RF signal over at least one antenna, wherein the carrier-aggregated RF signal is a carrier aggregation of a first RF signal in a first frequency band and of a second RF signal in a second frequency band;
propagating the carrier-aggregated RF signal from the at least one antenna over a bypass path that bypasses a bandpass filter to an input port of a broadband low-noise amplifier;
amplifying the carrier-aggregated RF signal in the broadband low-noise amplifier to provide an amplified RF signal;
propagating the amplified RF signal through a matching network to drive an amplified version of the first RF signal from a first output terminal for the matching network and to drive an amplified version of the second RF signal from a second output terminal for the matching network.

18. The method of claim 17, further comprising:
detecting an absence of a jamming signal, wherein the propagating of the carrier-aggregated RF signal over the bypass path is responsive to the detection of the absence of the jamming signal.

19. The method of claim 17, further comprising:
propagating the amplified RF signal through a first resonant circuit that is resonant at the second frequency band to output the amplified version of the first RF signal from the first resonant circuit; and
propagating the amplified RF signal through a second resonant circuit that is resonant at the first frequency band to output the amplified version of the second RF signal from the second resonant circuit.

20. A receiver front end, comprising:
a transformer having an input terminal for receiving an amplified carrier-aggregated RF signal;
a first resonant circuit coupled to the transformer through a first capacitor, the first resonant circuit configured to pass a first RF carrier signal modulated over a first frequency band and to block a second RF carrier signal modulated over a second frequency band; and
a second resonant circuit coupled to the transformer through a second capacitor, the second resonant circuit configured to pass the second RF carrier signal modulated over the second frequency band and to block the first RF carrier signal modulated over the first frequency band.

21. The receiver front end of claim 20, wherein the transformer comprises an autotransformer having a first tap coupled to the first resonant circuit, a second tap coupled to the second resonant circuit, and wherein the autotransformer includes a third tap, the receiver front end further comprising:
a power splitter coupled to the third tap, the power splitter being configured to split the amplified carrier-aggregated RF signal into a first RF signal and into a second RF signal.

22. The receiver front end of claim 20, wherein the transformer includes a primary winding and a secondary winding, and wherein the first resonant circuit and the second resonant circuit are both coupled to the secondary winding.

23. The receiver front end of claim 20, further comprising:
a low-noise amplifier configured to amplify a carrier-aggregated RF signal to produce the amplified carrier-aggregated RF signal.

24. The receiver front end of claim 23, further comprising:
a bandpass filter configured to select for the first frequency band; and
a bypass path configured to bypass the bandpass filter to drive the low-noise amplifier with the carrier-aggregated RF signal during a bypass mode of operation for the receiver front end.

25. A receiver front end, comprising:
a first bandpass filter configured to select for a first frequency band;
a bypass path;
a second bandpass filter configured to select for a second frequency band;
a first low-noise amplifier;
a second low-noise amplifier;
a switch matrix having a first configuration in which an antenna is coupled through the bypass path to the first low-noise amplifier and in which the antenna is isolated from the second low-noise amplifier, the switch matrix having a second configuration in which the antenna is coupled through the second bandpass filter to the second low-noise amplifier.

26. The receiver front end of claim 25, further comprising:
a third low-noise amplifier, wherein the switch matrix is further configured in the second configuration to isolate the first low-noise amplifier from the antenna and to couple the antenna through the first band bandpass filter to the third low-noise amplifier.

27. The receiver front end of claim 25, wherein the switch matrix is further configured in the second configuration to couple the antenna through the first bandpass filter to the first low-noise amplifier.

28. The receiver front end of claim 25, further comprising:
a jammer detector, wherein the jammer detector is configured to control the switch matrix to be in the second configuration in response to a jamming signal detection and to control the switch matrix to be in the first configuration in response to an absence of the jamming signal detection.

29. The receiver front end of claim 25, wherein the first bandpass filter and the second bandpass filter are configured so that the first frequency band is a first Long Term Evolution (LTE) frequency band and so that the second frequency band is a second LTE frequency band that is non-contiguous with the first LTE frequency band.

* * * * *